US009632156B2

(12) United States Patent
Liu et al.

(10) Patent No.: US 9,632,156 B2
(45) Date of Patent: Apr. 25, 2017

(54) EFFICIENT REDUNDANT HAAR MINIMIZATION FOR PARALLEL MRI RECONSTRUCTION

(71) Applicants: Jun Liu, Plainsboro, NJ (US); Jeremy Rapin, Paris (FR); Alban Lefebvre, Jersey City, NJ (US); Mariappan S. Nadar, Plainsboro, NJ (US); Ti-chiun Chang, Princeton Junction, NJ (US)

(72) Inventors: Jun Liu, Plainsboro, NJ (US); Jeremy Rapin, Paris (FR); Alban Lefebvre, Jersey City, NJ (US); Mariappan S. Nadar, Plainsboro, NJ (US); Ti-chiun Chang, Princeton Junction, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 1163 days.

(21) Appl. No.: 13/717,842

(22) Filed: Dec. 18, 2012

(65) Prior Publication Data
US 2013/0320974 A1    Dec. 5, 2013

Related U.S. Application Data

(60) Provisional application No. 61/654,227, filed on Jun. 1, 2012.

(51) Int. Cl.
*G06K 9/00*      (2006.01)
*G01R 33/48*     (2006.01)
(Continued)

(52) U.S. Cl.
CPC ...... *G01R 33/4818* (2013.01); *G01R 33/5611* (2013.01); *G06T 7/0012* (2013.01); *G06T 2207/10088* (2013.01)

(58) Field of Classification Search
None
See application file for complete search history.

(56) References Cited

U.S. PATENT DOCUMENTS

| 7,386,088 B2 * | 6/2008 | Deman | G06T 11/006 378/4 |
| 7,688,068 B2 * | 3/2010 | Beatty | A61B 5/055 324/307 |

(Continued)

OTHER PUBLICATIONS

Ramani et al. "Parallel MR Image Reconstruction Using Augmented Lagrangian Methods" IEEE Transactions on Imaging, vol. 30 No. 3, Mar. 2011, pp. 694-706.*

(Continued)

*Primary Examiner* — Matthew Bella
*Assistant Examiner* — Jose M Torres

(57) ABSTRACT

A method for parallel magnetic resonance imaging (MRI) reconstruction of digital images includes providing a set of acquired k-space MR image data v, a redundant Haar wavelet matrix W satisfying $W^T W=I$, wherein I is an identity matrix, a regularization parameter $\lambda \geq 0$, and a counter limit k, initializing a variable $z_0 = Wv$, and intermediate quantities $p_0 = q_0 = 0$, calculating $y_i = \arg \min_z \frac{1}{2}\|z-(p_i+z_i)\|_2^2 + \lambda\|z\|_1$ for $0 \leq i \leq k$, wherein z denotes values of an MR image sought to be reconstructed, updating $p_{i+1} = (p_i + z_i) - y_i$, updating $z_{i+1} = \arg \min_z \frac{1}{2}\|z-(q_i+z_i)\|_2^2 + g(z)$, wherein $$g(z) = \begin{cases} 0, & z = WW^T z, \\ +\infty, & \text{otherwise;} \end{cases}$$

and updating $q_{i+1} = (q_i + y_i) - z_{i-1}$, wherein $x = W^T z$ is a solution of (Continued)

$$\min_x \frac{1}{2}\|Wx - Wv\|_2^2 + \lambda\|Wx\|_1$$

that specifies a reconstruction of the MR image.

16 Claims, 4 Drawing Sheets

(51) Int. Cl.
  *G06T 7/00* (2017.01)
  *G01R 33/561* (2006.01)

(56) References Cited

U.S. PATENT DOCUMENTS

| | | | |
|---|---|---|---|
| 2005/0100202 A1* | 5/2005 | Huang | G01R 33/5611 382/128 |
| 2013/0099786 A1* | 4/2013 | Huang | G01R 33/246 324/309 |
| 2013/0121554 A1* | 5/2013 | Liu | G06T 11/005 382/131 |
| 2013/0181711 A1* | 7/2013 | Chaari | G01R 33/5611 324/309 |
| 2013/0259343 A1* | 10/2013 | Liu | G01R 33/5611 382/131 |

OTHER PUBLICATIONS

Amir Beck, et al., A Fast Iteractive Shrinkage-Thresholding Algorithm for Linear Inverse Problems, SIAM J. Imaging Sciences, vol. 2, No. 1, pp. 183-202 , 2009.

Richard L. Dykstra, "An Algorithm for Restricted Least Squares Regression," Journal of the American Statistical Association, vol. 78, No. 384, (Dec. 1984), pp. 837-842.

* cited by examiner

EFFICIENT REDUNDANT HAAR MINIMIZATION FOR PARALLEL MRI RECONSTRUCTION

CROSS REFERENCE TO RELATED UNITED STATES APPLICATIONS

This application claims priority from "Redundant, Efficient Haar Minimization", U.S. Provisional Application No. 61/654,227 of Liu, et al., filed Jun. 1, 2012, the contents of which are herein incorporated by reference in their entirety.

TECHNICAL FIELD

This disclosure is directed to methods for parallel reconstruction of digital images.

DISCUSSION OF THE RELATED ART

Magnetic resonance imaging (MRI) is a medical imaging technique used in radiology to visualize internal structures of the body in detail. As a non-invasive imaging technique, MRI makes use of nuclear magnetic resonance to image nuclei of atoms inside the body. MRI has been used for imaging the brain, muscles, the heart, cancers, etc.

The raw data acquired by an MR scanner are the Fourier coefficients, or the so-called k-space data. FIG. 1(a) depicts an MR image and the full k-space data, displayed in a logarithmic scale, and FIG. 1(b) depicts the image obtained by applying an inverse Fourier transform to the k-space data of FIG. 1(a). The k-space data are typically acquired by a series of phase encodings, in which each phase encoding includes a given amount of k-space data that are related to the sampling. For example, with Cartesian sampling, 256 frequency encodings are needed to cover the full k-space of one 256×256 image. The time between the repetitions of the sequence is called the repetition time (TR) and is a measure of the time needed for acquiring one phase encoding. For example, if TR=50 ms, it takes about 12.8 seconds to acquire a full k-space data of one 256×256 image with Cartesian sampling. With the same TR, it takes about 15.4 minutes to acquire the full k-space of a 256×256×72 volume. With higher spatial resolution, the time for acquiring a full k-space may be even greater. In addition, in dynamic cine imaging, one is interested in the study of the motion of an object, such as the heart or blood, over time. This leads to an increased number of phase encodings and increased acquisition time, and one usually has to compromise between spatial resolution and temporal resolution. To reduce the acquisition time, one may undersample the k-space, i.e., reduce the number of acquired phase encodings. For example, if the k-space data are acquired every other line, as shown in FIG. 1(c), the acquisition time can be reduced by half. The relationship between the acquired k-space data and the image to be reconstructed can be written as $$y = F_u x + n, \quad (1)$$

where $F_u$ is a given undersampled Fourier transform operator, x denotes the MR image, y is the acquired k-space data, and n denotes the noise introduced in the acquisition. Unlike the full k-space scenario, one cannot directly apply the inverse Fourier transform to the undersampled data acquired in FIG. 1(c), since otherwise an aliased image as shown in FIG. 1(d) is obtained.

Parallel imaging has been proven effective for reducing acquisition time. Parallel imaging exploits differences in sensitivities between individual coil elements in a receiver array to reduce the number of gradient encodings required for imaging. FIG. 2 illustrates parallel imaging with 8 coils. In particular, the first two rows of FIG. 2 show the coil images seen by the individual coil/channel, and the last two rows show the sensitivities of these 8 coils. It can be observed that the 8 coils have different sensitivities. Parallel imaging tries to reconstruct the target image with the undersampled k-space data.

Sensitivity encoding (SENSE) is a technique that can reduce scan time in magnetic resonance imaging (MRI). A SENSE approach utilizes the spatial information related to the coils of a receiver array for reducing conventional Fourier encoding. In principle, SENSE can be applied to any imaging sequence and k-space trajectories, however, it is particularly feasible for Cartesian sampling schemes. In the SENSE approach, one models the relationship between the target image and the acquired k-space data as:

$$y_i = F_u S_i x + n_i, \quad (2)$$

where $y_i$ is the undersampled k-space data acquired by the i-th coil, and $S_i$ is the coil sensitivity maps, as shown in the last two rows of FIG. 2.

To recover x from EQ. (2), one should note that the target x has certain structures, with which one can better reconstruct x from the undersampled data y. This is where sparse learning can play a role. Typically, x can be computed by minimizing the following expression:

$$\min_x \sum_i \text{loss}(y, F_u S_i x) + \lambda \phi(x) \quad (3)$$

where loss(y, $F_u$x) denotes the data fidelity, and $\phi(x)$ incorporates prior knowledge about the image to be reconstructed. The efficient optimization of EQ. (3) is key to parallel imaging.

The data fidelity term is typically defined as the squared distance between the acquired data and the prediction: loss(y, $F_u$x)=½$\|y-F_u S_i x\|_2^2$. The term for $\phi(x)$ should incorporate the structure in the target image x. FIG. 3 illustrates the gradient of the phantom shown in FIG. 1 along the vertical direction (left) and horizontal direction (right), respectively, and one may observe that such gradient is sparse.

Redundant Haar minimization, which is the minimization of the combination of the data fidelity and the L1 regularization via redundant Haar wavelets, has been proven effective for parallel MRI reconstruction. When minimizing via Nesterov's accelerated gradient algorithm, a key building block is the so-called proximal operator associated with the redundant Haar penalty. Such a proximal operator does not allow a closed form solution, which adds to the difficulty of optimization. A low precision solution of such proximal operator usually leads to slow convergence or no convergence at all. Therefore, it is useful to have an efficient solver for such proximal operator.

SUMMARY

Exemplary embodiments of the invention as described herein generally include methods for solving a proximal operator using a restricted least squares regression algorithm, an alternating algorithm for solving the dual system, and a novel and effective warm start technique for fast convergence. An equivalent relationship is established between a restricted least squares regression algorithm according to an embodiment of the invention, and the alternating algorithm according to an embodiment of the invention.

According to an aspect of the invention, there is provided a method for parallel magnetic resonance imaging (MRI) reconstruction of digital images, including providing a set of acquired k-space MR image data v, a redundant Haar wavelet matrix W satisfying $W^TW=I$, wherein I is an identity matrix, a regularization parameter $\lambda \geq 0$, and a counter limit k, initializing a variable $z_0=Wv$, and intermediate quantities $p_0=q_0=0$, calculating $y_i=\arg\min_z \frac{1}{2}\|z-(p_i+z_i)\|_2^2+\lambda\|z\|_1$ for $0 \leq i \leq k$, wherein z denotes values of an MR image sought to be reconstructed, updating $p_{i+1}=(p_i+z_i)-y_i$, updating $z_{i+1}=\arg\min_z \frac{1}{2}\|z-(q_i+z_i)\|_2^2+g(z)$, wherein $$g(z) = \begin{cases} 0, & z = WW^Tz, \\ +\infty, & \text{otherwise;} \end{cases}$$

and updating $q_{i+1}=(q_i+y_i)-z_{i+1}$, wherein $x=W^Tz$ is a solution of $$\min_x \frac{1}{2}\|Wx - Wv\|_2^2 + \lambda\|Wx\|_1$$

that specifies a reconstruction of the MR image.

According to a further aspect of the invention, $$\operatorname{argmin}_z \frac{1}{2}\|z - (p_i+z_i)\|_2^2 + \lambda\|z\|_1 = \begin{cases} (p_i+z_i) - \lambda, & (p_i+z_i) > \lambda, \\ (p_i+z_i) + \lambda, & (p_i+z_i) < -\lambda, \\ 0, & \text{otherwise.} \end{cases}$$

According to a further aspect of the invention, $\arg\min_z \frac{1}{2}\|z-(q_i+z_i)\|_2^2 + g(z) = WW^T(q_i+z_i)$.

According to another aspect of the invention, there is provided a method for parallel MRI reconstruction of digital images, including providing a set of acquired k-space MR image data v, a redundant Haar wavelet matrix W satisfying $W^TW=I$, wherein I is an identity matrix, a regularization parameter $\lambda \geq 0$, a counter limit k, an initial value of a dual variable p derived by forming a dual to a quadratic program $$\min_{z:z=WW^Tz} \frac{1}{2}\|z - Wv\|_2^2 + \lambda\|z\|_1$$

that represents parallel reconstruction of a magnetic resonance (MR) image, and an initial value of a Lagrange multiplier $\tilde{q}$ of the constraint an initial value of $z=WW^Tz$, calculating $$p_{i+1} = \operatorname*{argmin}_{p:\|p\|_\infty \leq \lambda} \frac{1}{2}\|p - (Wv - (I - WW^T)\tilde{q}_i)\|_2^2 \text{ for } 0 \leq i \leq k,$$

calculating an intermediate value $y_i=(Wv-(I-WW^T)\tilde{q}_i)-p_{i+1}$, updating $$\tilde{q}_{i+1} = \operatorname*{argmin}_{\tilde{q}} \frac{1}{2}\|(I - WW^T)\tilde{q}_i - (Wv - p_i)\|_2^2,$$

calculating $q_{i+1}=(I-WW^T)\tilde{q}_{i+1}$, and calculating $z_{i+1}=(Wv-p_{i+1})-q_{i+1}$, wherein $x=W^Tz$ is a solution of $$\min_x \frac{1}{2}\|Wx - Wv\|_2^2 + \lambda\|Wx\|_1$$

that specifies a reconstruction of the MR image.

According to a further aspect of the invention, $$\operatorname*{argmin}_{\|p\|_\infty \leq \lambda} \frac{1}{2}\|p - (Wv - (I - WW^T)\tilde{q}_i)\|_2^2 =$$

$$\begin{cases} \lambda, & (Wv - (I - WW^T)\tilde{q}_i) > \lambda, \\ -\lambda, & (Wv - (I - WW^T)\tilde{q}_i) < -\lambda, \\ (Wv - (I - WW^T)\tilde{q}_i), & \text{otherwise.} \end{cases}$$

According to a further aspect of the invention, $\frac{1}{2}\|(I-WW^T)\tilde{q}_i-(Wv-p_i)\|_2^2$ is minimized by $(I-WW^T)\tilde{q}_{i+1}=(I-WW^T)(Wv-p_i)$.

According to a further aspect of the invention, if dual variable p and Lagrange multiplier $\tilde{q}$ are both initialized to 0, $$\begin{aligned} y_i &= S(Wv - (I - WW^T)\tilde{q}_i, \lambda) \\ &= S(p_i + z_i, \lambda) \\ &= \operatorname*{argmin}_z \frac{1}{2}\|z - (p_i + z_i)\|_2^2 + f(z), \end{aligned}$$

wherein S is defined as $$S(v, \lambda) = \begin{cases} v - \lambda, & v > \lambda, \\ v + \lambda, & v < -\lambda, \\ 0, & \text{otherwise.} \end{cases}$$

According to a further aspect of the invention, if dual variable p and Lagrange multiplier $\tilde{q}$ are both initialized to 0, $$\begin{aligned} z_{i+1} &= WW^T(Wv - p_{i+1}) \\ &= WW^T(q_i + y_i) \\ &= \operatorname*{argmin}_z \frac{1}{2}\|z - (q_i + y_i)\|_2^2 + g(z), \end{aligned}$$

$$\text{wherein } g(z) = \begin{cases} 0, & z = WW^Tz, \\ +\infty, & \text{otherwise.} \end{cases}$$

According to another aspect of the invention, there is provided a non-transitory program storage device readable by a computer, tangibly embodying a program of instructions executed by the computer to perform the method steps for parallel magnetic resonance imaging (MRI) reconstruction of digital images.

DETAILED DESCRIPTION OF EXEMPLARY EMBODIMENTS

Figure 1:
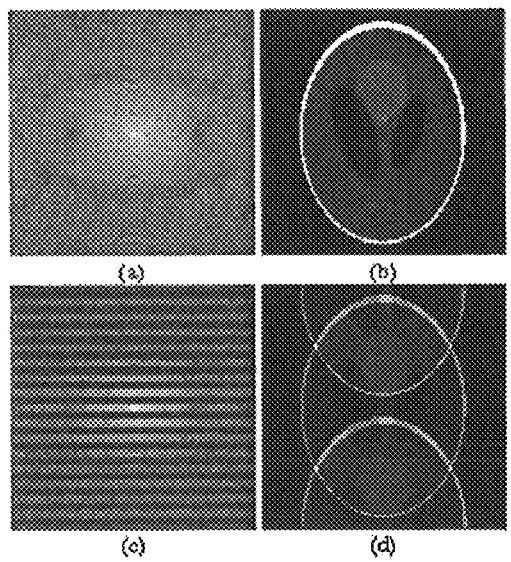
FIG. 1 illustrates MR images and their k-space data, according to an embodiment of the invention.
Figure 2:
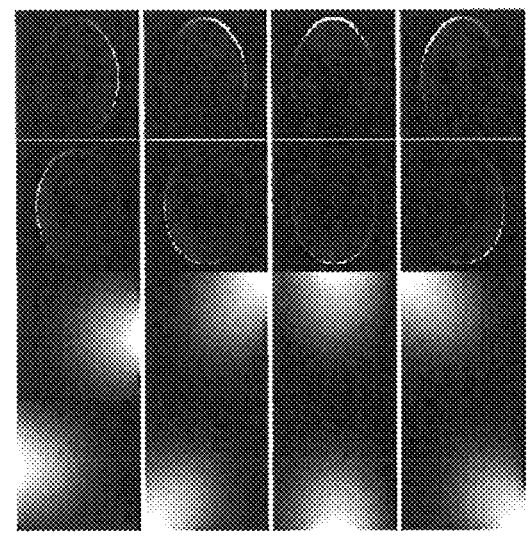
FIG. 2 illustrates coil images and coil sensitivity profiles, according to an embodiment of the invention.
Figure 3:
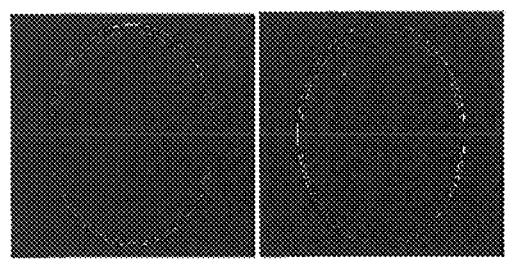
FIG. 3 shows the gradient of a phantom, according to an embodiment of the invention.

Exemplary embodiments of the invention as described herein generally include systems and methods for efficient redundant Haar minimization for parallel MRI reconstruction. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

As used herein, the term "image" refers to multi-dimensional data composed of discrete image elements (e.g., pixels for 2-dimensional images and voxels for 3-dimensional images). The image may be, for example, a medical image of a subject collected by computer tomography, magnetic resonance imaging, ultrasound, or any other medical imaging system known to one of skill in the art. The image may also be provided from non-medical contexts, such as, for example, remote sensing systems, electron microscopy, etc. Although an image can be thought of as a function from $R^3$ to $R$ or $R^7$, the methods of the inventions are not limited to such images, and can be applied to images of any dimension, e.g., a 2-dimensional picture or a 3-dimensional volume. For a 2- or 3-dimensional image, the domain of the image is typically a 2- or 3-dimensional rectangular array, wherein each pixel or voxel can be addressed with reference to a set of 2 or 3 mutually orthogonal axes. The terms "digital" and "digitized" as used herein will refer to images or volumes, as appropriate, in a digital or digitized format acquired via a digital acquisition system or via conversion from an analog image.

Parallel MRI reconstruction can be modeled by the following program:

$$\min_x \frac{1}{2}\|Ax-y\|_2^2 + \lambda\|Wx\|_1, \quad (4)$$

where y denotes acquired k-space MR image data, x denotes intensities of the MR image one seeks to reconstruct, $A=FS$, $F=\text{diag}(F_u, F_u, \ldots, F_u)$ is a matrix of size $cM \times cN$, $F_u$ is a partial FFT matrix of size $M \times N$, $S=[S_1, S_2, \ldots, S_c]^H$ is the (conjugate transpose) coil sensitivity maps (CSM) matrix with $S_i$ being a matrix of size $N \times N$, W is a redundant Haar wavelet matrix satisfying $W^TW=I$, and $\lambda$ is the regularization parameter.

One effective approach for solving EQ. (4) is Nesterov's algorithm, also known as FISTA (Fast Iterative Shrinkage-Thresholding Algorithm). Given a function to be minimized of the form $F(x):=f(x)+g(x)$, the steps of a FISTA with constant stepsize are as follows, where Step k is repeated until convergence:

Input $L = L(f)$ – A Lipschitz constant of $\nabla f$.

Step 0. Initialize $y_1 = x_0 \in R^n$, $t_1 = 0$

Step $k$. $(k \geq 1)$ Compute $x_k = p_L(y_k)$, where $$p_L(y) = \text{argmin}_x \left\{ g(x) + \frac{L}{2}\left\|x - \left(y - \frac{1}{L}\nabla f(y)\right)\right\|^2 \right\}$$

$$t_{k+1} = \frac{1 + \sqrt{1+4t_k^2}}{2},$$

$$y_{k+1} = x_k + \left(\frac{t_k - 1}{t_{k+1}}\right)(x_k - x_{k-1})$$

A feature of this algorithm is that it can achieve a convergence rate of $O(1/k^2)$, which is optimal for all first-order black-box algorithms. When applying FISTA, a key building block is the proximal operator associated with the regularization term:

$$\pi(v) = \text{argmin}_x \frac{1}{2}\|x-v\|_2^2 + \lambda\|Wx\|_1, \quad (5)$$

where v is a result of the gradient descent, i.e., $$\left(y - \frac{1}{L}\nabla f(y)\right)$$

in the previous algorithm. The efficient solution of such a proximal operator is a key to the resulting algorithm. However, such a proximal operator does not have a closed form solution.

An efficient approach according to an embodiment of the invention for solving EQ. (2) incorporates the relationship $W^TW=I$ into EQ. (5):

$$\min_x \frac{1}{2}\|Wx - Wv\|_2^2 + \lambda\|Wx\|_1. \quad (6)$$

Let $z=Wx$, which implicitly induces the following relationship $$z = WW^T z. \quad (7)$$

The above equation indicates that z is in the range space of W. Thus, solving EQ. (6) is equivalent to solving $$\min_{z: z=WW^Tz} \frac{1}{2}\|z - Wv\|_2^2 + \lambda\|z\|_1. \quad (8)$$

The following theorem justifies the conversion of EQ. (5) into EQ. (8):
Theorem 1 Let z* be the solution to EQ. (8). Then, $x^* = W^T z^*$ is the optimal solution to EQ. (5).
Proof: For all x, let z=Wx. We have $x = W^T z$ from $W^T W = I$. It is obvious that the relationship in EQ. (7) holds. As z* is the optimal solution to EQ. (8), which satisfies $z^* = WW^T z^*$ and $z^* = Wx^*$, we have $$\tfrac{1}{2}\|z^* - Wv\|_2^2 + \lambda\|z^*\|_1 \le \tfrac{1}{2}\|z - Wv\|_2^2 + \lambda\|z\|_1 \quad (9)$$

Inserting in $z^* = WW^T z^*$, $z = WW^T z$, $z^* = Wx^*$ and z=Wx, we have $$\tfrac{1}{2}\|WW^T z^* - Wv\|_2^2 + \lambda\|Wx^*\|_1 \le \tfrac{1}{2}\|WW^T z - Wv\|_2^2 + \lambda\|Wx\|_1 \quad (10)$$

which together with $W^T W = I$ leads to $$\tfrac{1}{2}\|W^T z^* - v\|_2^2 + \lambda\|Wx^*\|_1 \le \tfrac{1}{2}\|W^T z - v\|_2^2 + \lambda\|Wx\|_1. \quad (11)$$

Incorporating $x^* = W^T z^*$ and $x = W^T z$, we have $$\tfrac{1}{2}\|x^* - v\|_2^2 + \lambda\|Wx^*\|_1 \le \tfrac{1}{2}\|x - v\|_2^2 + \lambda\|Wx\|_1, \quad (12)$$

which indicates that x* is the optimal solution to EQ. (5).

When solving EQ. (4) via FISTA, embodiments of the invention use a "warm" start technique, i.e., solving EQ. (5) with the solution to the previous program as the "warm" start.

According to an embodiment of the invention, EQ. (8) can be solved via a restricted least squares regression algorithm. For convenience of discussion, let $$f(z) = \lambda\|z\|_1 \quad (13)$$

and $$g(z) = \begin{cases} 0, & z = WW^T z, \\ +\infty, & \text{otherwise.} \end{cases} \quad (14)$$

Figure 4:
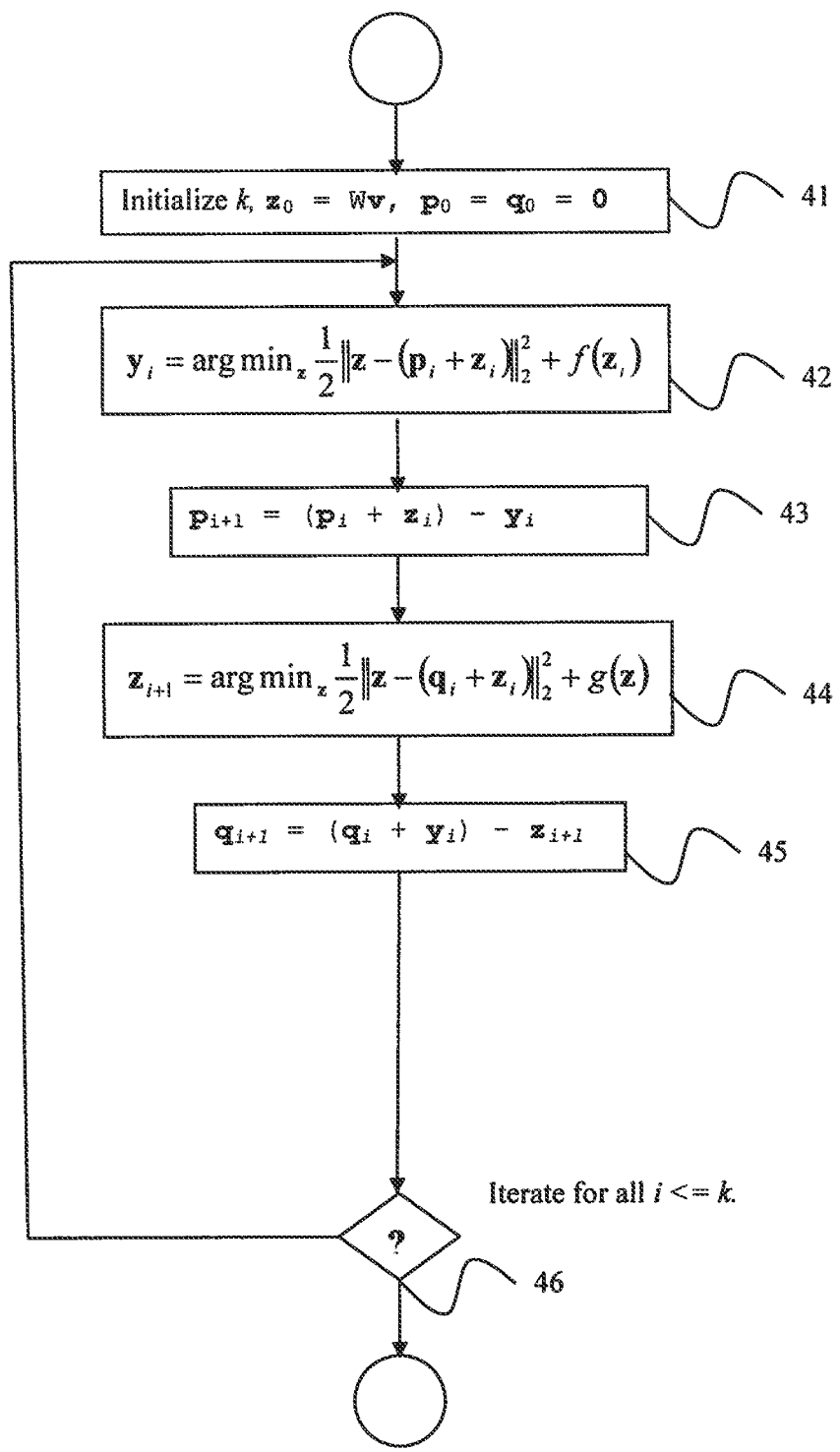
FIG. 4 is a flowchart of a restricted least squares regression algorithm according to an embodiment of the invention.

A restricted least squares regression algorithm according to an embodiment of the invention is presented in Algorithm 1, which recursively calls the solver to the proximal operator associated with f(.) and g(.), respectively. Algorithm 1 is as follows, with reference to the steps of the flowchart of FIG. 4.

Algorithm 1:

| Input: W, v, 0 ≤ λ, k |  |
|---|---|
| 1: $z_0 = Wv$, $p_0 = q_0 = 0$ | (step 41) |
| 2: for i = 0 to k do |  |
| 3: $\quad y_i = \arg\min_z \tfrac{1}{2}\|z - (p_i + z_i)\|_2^2 + f(z)$ | (step 42) |
| 4: $\quad p_{i+1} = (p_i + z_i) - y_i$ | (step 43) |
| 5: $\quad z_{i+1} = \arg\min_z \tfrac{1}{2}\|z - (q_i + z_i)\|_2^2 + g(z)$ | (step 44) |
| 6: $\quad q_{i+1} = (q_i + y_i) - z_{i+1}$ | (step 45) |
| 7: end for | (step 46) |
| 8: return $z_{k+1}$ |  |

According to an embodiment of the invention, the proximal operator associated with f(.) can be computed by soft shrinkage as:

$$\pi_f(v) = \arg\min_z \tfrac{1}{2}\|z - v\|_2^2 + f(z) \quad (15)$$

$$= \begin{cases} v_i - \lambda, & v_i > \lambda, \\ v_i + \lambda, & v_i < -\lambda, \\ 0, & \text{otherwise.} \end{cases}$$

According to an embodiment of the invention, the proximal operator associated with g(.) can be computed by orthogonal projection as:

$$\pi_g(v) = \arg\min_z \tfrac{1}{2}\|z - v\|_2^2 + g(z) = WW^T v. \quad (16)$$

Algorithm 1 is guaranteed to converge to the optimal solution of EQ. (8).

According to an embodiment of the invention, an alternating algorithm can solve the dual of EQ. (8).

Making use of the dual norm of the $l_1$ norm, EQ. (8) can be written as:

$$\min_{z:z=WW^T z} \max_{p:\|p\|_\infty \le \lambda} \tfrac{1}{2}\|z - Wv\|_2^2 + z^T p. \quad (17)$$

The objective function in EQ. (17) is convex in z and concave in p, and the constraints are closed convex. Therefore, the von Neuman Lemma that ensures the existence of a solution to the min-max holds, and the min-max can be exchanged to obtain $$\max_{p:\|p\|_\infty \le \lambda} \min_{z:z=WW^T z} \tfrac{1}{2}\|z - Wv\|_2^2 + z^T p. \quad (18)$$

For the inner minimization of EQ. (18), i.e., $$\min_{z:z=WW^T z} \tfrac{1}{2}\|z - Wv\|_2^2 + z^T p, \quad (19)$$

embodiments introduce a Lagrangian variable $\tilde{q}$ for the equality constraint. As the constraint is affine, and the objective function is differentiable and convex, strong duality holds. Thus, EQ. (19) can be written as the following equivalent min-max program:

$$\max_{\tilde{q}} \min_{z:z=WW^T z} \tfrac{1}{2}\|z - Wv\|_2^2 + z^T p + \langle z - WW^T z, \tilde{q} \rangle. \quad (20)$$

Thus, embodiments can reformulate EQ. (8) as the following min-max optimization:

$$\max_{\tilde{q},p:\|p\|_\infty \le \lambda} \min_{z:z=WW^T z} \tfrac{1}{2}\|z - Wv\|_2^2 + z^T p + \langle z - WW^T z, \tilde{q} \rangle. \quad (21)$$

For the inner minimization, setting the derivative of z to zero, one has $$z = Wv - p - (I - WW^T)\tilde{q}. \quad (22)$$

Inserting EQ. (22) into EQ. (21), the following dual program can be obtained:

$$\max_{\tilde{q}, p: \|p\|_\infty} -\frac{1}{2}\|p + (I - WW^T)\tilde{q} - Wv\|_2^2 + \frac{1}{2}\|Wv\|_2^2. \quad (23)$$

Figure 5:
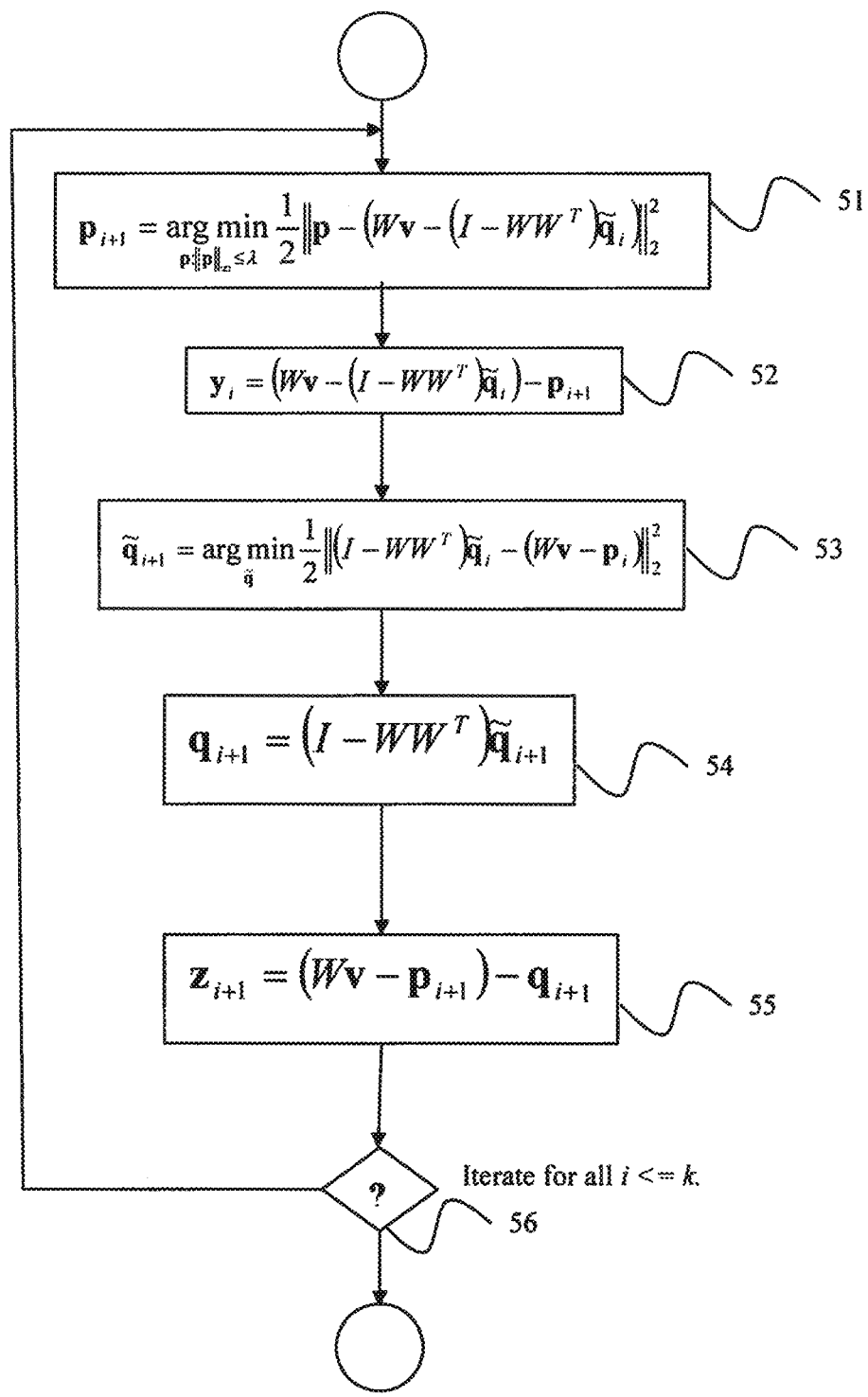
FIG. 5 is a flowchart of an alternating algorithm for solving the dual program, according to an embodiment of the invention.

Embodiments of the invention solve the dual program (23) via an alternating algorithm in Algorithm 2. Step 3 and Step 5 are included for convenience of analyzing the relationship with Algorithm 1. Algorithm 2 is guaranteed to converge as the objective function of EQ. (23) is concave in both $\tilde{q}$ and p, and the constraint sets are convex and closed. Algorithm 2 is as follows, with references to step numbers in the flowchart of FIG. 5

Algorithm 2 Alternating Algorithm for EQ. (8)

Input $W, v, 0 \le \lambda, k, p_0, \tilde{q}_0$ 1 for $i = 0$ to $k$ do

2 $p_{i+1} = \underset{p: \|p\|_\infty \le \lambda}{\operatorname{argmin}} \frac{1}{2}\|p - (Wv - (I - WW^T)\tilde{q}_i)\|_2^2$ (step 51)

3. $y_i = (Wv - (I - WW^T)\tilde{q}_i) - p_{i+1}$ (step 52)

4. $\tilde{q}_{i+1} = \underset{\tilde{q}}{\operatorname{argmin}} \frac{1}{2}\|(I - WW^T)\tilde{q}_i - (Wv - p_i)\|_2^2$ (step 53)

5. $q_{i+1} = (I - WW^T)\tilde{q}_{i+1}$ (step 54)

6. $z_{i+1} = (Wv - p_{i+1}) - q_{i+1}$ (step 55)

7. end for (step 56)

8. return $z_{k+1}$

In Step 2, $p_{i+1}$ can be computed by a simple projection onto to the $l_\infty$ ball as follows:

$$\pi_\infty(v) = \underset{\|p\|_\infty \le \lambda}{\operatorname{argmin}} \frac{1}{2}\|p - v\|_2^2 \quad (24)$$

$$= \begin{cases} \lambda, & v_i > \lambda, \\ -\lambda, & v_i < \lambda, \\ v_i, & \text{otherwise.} \end{cases}$$

In Step 4, $\tilde{q}_{i+1}$, the solution to the minimization is not unique. However, $(I-WW^T)\tilde{q}_{i+1}$ is unique, and satisfies $$(I-WW^T)\tilde{q}_{i+1}=(I-WW^T)(Wv-p_i). \quad (25)$$

To see this, for the objective function in Step 4, set the derivative with regard to $\tilde{q}$ to zero, to obtain $$(I-WW^T)^T((I-WW^T)\tilde{q}_{i+1}-(Wv-p_i)). \quad (26)$$

EQ, (25) can be obtained by using the relationship $W^TW=I$.

The equivalence between Algorithm 1 and Algorithm 2, when the inputs $p_0, \tilde{q}_0$, are both set to zero in Algorithm 2, may be established as follows.

In Algorithm 2, Step 3 can be computed as $$y_i = S(Wv - (I - WW^T)\tilde{q}_i, \lambda) \quad (27)$$

$$= S(p_i + z_i, \lambda)$$

$$= \underset{z}{\operatorname{argmin}} \frac{1}{2}\|z - (p_i + z_i)\|_2^2 + f(z)$$

where S is the soft shrinkage operator, defined as $$S(v, \lambda) = \begin{cases} v - \lambda, & v > \lambda, \\ v + \lambda, & v < -\lambda, \\ 0, & \text{otherwise.} \end{cases}$$

Step 6 can be computed as $$z_{i+1} = WW^T(Wv - p_{i+1}) \quad (28)$$

$$= WW^T(q_i + y_i)$$

$$= \underset{z}{\operatorname{argmin}} \frac{1}{2}\|z - (q_i + y_i)\|_2^2 + g(z)$$

In Step 2, $p_{i+1}$ satisfies $$p_{i+1} = \underset{p: \|p\|_\infty \le \gamma}{\operatorname{argmin}} \frac{1}{2}\|p - (Wv - (I - WW^T)\tilde{q}_i)\| \quad (29)$$

$$= \pi_\infty(Wv - (I - WW^T)\tilde{q}_i).$$

It is to be understood that embodiments of the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

Figure 6:
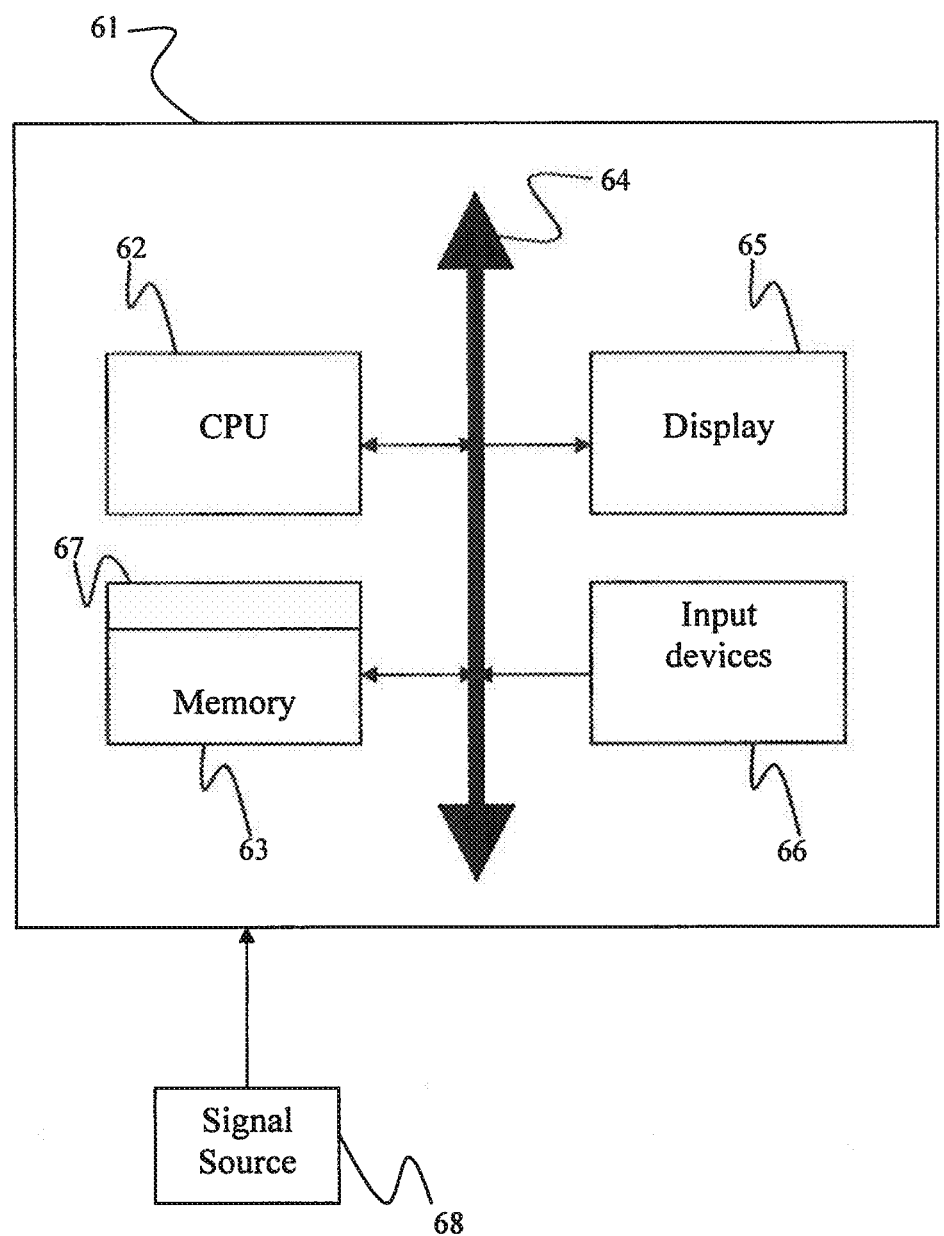
FIG. 6 is a block diagram of an exemplary computer system for implementing an efficient redundant Haar minimization for parallel MRI reconstruction, according to an embodiment of the invention.

FIG. 6 is a block diagram of an exemplary computer system for implementing a an efficient redundant Haar minimization for parallel MRI reconstruction, according to an embodiment of the invention. Referring now to FIG. 6, a computer system 61 for implementing the present invention can comprise, inter alia, a central processing unit (CPU) 62, a memory 63 and an input/output (I/O) interface 64. The computer system 61 is generally coupled through the I/O interface 64 to a display 65 and various input devices 66 such as a mouse and a keyboard. The support circuits can include circuits such as cache, power supplies, clock circuits, and a communication bus. The memory 63 can include random access memory (RAM), read only memory (ROM), disk drive, tape drive, etc., or a combinations thereof. The present invention can be implemented as a routine 67 that is stored in memory 63 and executed by the CPU 62 to process the signal from the signal source 68. As such, the computer system 61 is a general purpose computer system that becomes a specific purpose computer system when executing the routine 67 of the present invention.

The computer system 61 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the embodiments of the present invention have been described in detail with reference to exemplary embodiments, those skilled in the art will appreciate that various modifications and substitutions can be made thereto without departing from the spirit and scope of the invention as set forth in the appended claims.

What is claimed is:

1. A method for parallel magnetic resonance imaging (MRI) reconstruction of digital images, comprising:
   providing a set of acquired raw k-space MR image data v, a redundant Haar wavelet matrix W satisfying $W^T W = I$, wherein I is an identity matrix, a regularization parameter $\lambda \geq 0$, and a counter limit k;
   obtaining a proximal operator, the proximal operator obtained by the steps of:
   initializing a variable $z_0 = Wv$, and intermediate quantities $p_0 = q_0 = 0$;
   calculating $y_i = \arg\min_z \frac{1}{2}\|z - (p_i + z_i)\|_2^2 + \lambda\|z\|_1$ for $0 \leq i \leq k$, wherein z denotes values of an MR image sought to be reconstructed;
   updating $p_{i+1} = (p_i + z_i) - y_i$;
   updating $z_{i+1} = \arg\min_z \frac{1}{2}\|z - (q_i + z_i)\|_2^2 + g(z)$, wherein $$g(z) = \begin{cases} 0, & z = WW^T z, \\ +\infty, & \text{otherwise;} \end{cases}$$

updating $q_{i+1} = (q_i + y_i) - z_{i+1}$,
   wherein $x = W^T z$ is a solution of $$\min_x \frac{1}{2}\|Wx - Wv\|_2^2 + \lambda\|Wx\|_1$$

that specifies a reconstruction of the MR image; and
   reconstructing a digital MR image by applying the proximal operator to the acquired raw k-space MR image data, the digital MR image displayable on a computer system display.

2. The method of claim 1, wherein $$\arg\min_z \frac{1}{2}\|z - (p_i + z_i)\|_2^2 + \lambda\|z\|_1 = \begin{cases} (p_i + z_i) - \lambda, & (p_i + z_i) > \lambda, \\ (p_i + z_i) + \lambda, & (p_i + z_i) - \lambda, \\ 0, & \text{otherwise.} \end{cases}$$

3. The method of claim 1, wherein $$\arg\min_z \tfrac{1}{2}\|z - (q_i + z_i)\|_2^2 + g(z) = WW^T(q_i + z_i).$$

4. A method for parallel MRI reconstruction of digital images, comprising:
   providing a set of acquired raw k-space MR image data v, a redundant Haar wavelet matrix W satisfying $W^T W = I$, wherein I is an identity matrix, a regularization parameter $\lambda \geq 0$, a counter limit k, an initial value of a dual variable p derived by forming a dual to a quadratic program $$\min_{z: z = WW^T z} \frac{1}{2}\|z - Wv\|_2^2 + \lambda\|z\|_1$$

that represents parallel reconstruction of a magnetic resonance (MR) image, and an initial value of a Lagrange multiplier $\tilde{q}$ of the constraint an initial value of $z = WW^T z$;
   obtaining a proximal operator, the proximal operator obtained by the steps of:
   calculating $$p_{i+1} = \arg\min_{p:\|p\|_\infty \leq \lambda} \frac{1}{2}\|p - (Wv - (I - WW^T)\tilde{q}_i)\|_2^2 \text{ for } 0 \leq i \leq k;$$

calculating an intermediate value $y_i = (Wv - (I - WW^T)\tilde{q}_i) - p_{i+1}$;
   updating $$\tilde{q}_{i+1} = \arg\min_{\tilde{q}} \frac{1}{2}\|(I - WW^T)\tilde{q}_i - (Wv - p_i)\|_2^2;$$

calculating $q_{i+1} = (I - WW^T)\tilde{q}_{i+1}$;
   calculating $z_{i+1} = (Wv - p_{i+1}) - q_{i+1}$,
   wherein $x = W^T z$ is a solution of $$\min_x \frac{1}{2}\|Wx - Wv\|_2^2 + \lambda\|Wx\|_1$$

that specifies a reconstruction of the MR image; and
   reconstructing a digital MR image by applying the proximal operator to the acquired raw k-space MR image data, the digital MR image displayable on a computer system display.

5. The method of claim 4, wherein $$\arg\min_{\|p\|_\infty \leq \lambda} \frac{1}{2}\|p - (Wv - (I - WW^T)\tilde{q}_i)\|_2^2 =$$

$$\begin{cases} \lambda, & (Wv - (I - WW^T)\tilde{q}_i) > \lambda, \\ -\lambda, & (Wv - (I - WW^T)\tilde{q}_i) < -\lambda, \\ (Wv - (I - WW^T)\tilde{q}_i), & \text{otherwise.} \end{cases}$$

6. The method of claim 4, wherein $\frac{1}{2}\|(I - Wv^T)\tilde{q}_i - (Wv - p_i)\|_2^2$ is minimized by $(I - WW^T)\tilde{q}_{i+1} = (I - WW^T)(Wv - p_i)$.

7. The method of claim 4, wherein, if dual variable p and Lagrange multiplier $\tilde{q}$ are both initialized to 0, $$y_i = S(Wv - (I - WW^T)\tilde{q}_i, \lambda)$$

$$= S(p_i + z_i, \lambda)$$

$$= \arg\min_z \frac{1}{2}\|z - (p_i + z_i)\|_2^2 + f(z),$$

wherein S is defined as $$S(v, \lambda) = \begin{cases} v - \lambda, & v > \lambda, \\ v + \lambda, & v < -\lambda, \\ 0, & \text{otherwise.} \end{cases}$$

8. The method of claim 4, wherein, if dual variable p and Lagrange multiplier $\tilde{q}$ are both initialized to 0, $$\begin{aligned} z_{i+1} &= WW^T(Wv - p_{i+1}) \\ &= WW^T(q_i + y_i) \\ &= \operatorname*{argmin}_z \frac{1}{2}\|z - (q_i + y_i)\|_2^2 + g(z), \end{aligned}$$

wherein $g(z) = \begin{cases} 0, & z = WW^T z, \\ +\infty, & \text{otherwise.} \end{cases}$ 9. A non-transitory program storage device readable by a computer, tangibly embodying a program of instructions executed by the computer to perform the method steps for parallel magnetic resonance imaging (MRI) reconstruction of digital images, the method comprising the steps of:
providing a set of acquired raw k-space MR image data v, a redundant Haar wavelet matrix W satisfying $W^T W = I$, wherein I is an identity matrix, a regularization parameter $\lambda \geq 0$, and a counter limit k;
obtaining a proximal operator, the proximal operator obtained by the steps of:
initializing a variable $z_0 = Wv$, and intermediate quantities $p_0 = q_0 = 0$;
calculating $y_i = \arg\min_z \frac{1}{2}\|z - (p_i + z_i)\|_2^2 + \lambda\|z\|_1$ for $0 \leq i \leq k$, wherein z denotes values of an MR image sought to be reconstructed;
updating $p_{i+1} = (p_i + z_i) - y_i$;
updating $z_{i+1} = \arg\min_z \frac{1}{2}\|z - (q_i + z_i)\|_2^2 + g(z)$, wherein $$g(z) = \begin{cases} 0, & z = WW^T z, \\ +\infty, & \text{otherwise;} \end{cases}$$

updating $q_{i+1} = (q_i + y_i) - z_{i+1}$,
wherein $x = W^T z$ is a solution of $$\min_x \frac{1}{2}\|Wx - Wv\|_2^2 + \lambda\|Wx\|_1$$

that specifies a reconstruction of the MR image; and
reconstructing a digital MR image by applying the proximal operator to the acquired raw k-space MR image data, the digital MR image displayable on a computer system display.

10. The computer readable program storage device of claim 9, wherein $$\operatorname*{argmin}_z \frac{1}{2}\|z - (p_i + z_i)\|_2^2 + \lambda\|z\|_1 = \begin{cases} (p_i + z_i) - \lambda, & (p_i + z_i) > \lambda, \\ (p_i + z_i) + \lambda, & (p_i + z_i) < -\lambda, \\ 0, & \text{otherwise.} \end{cases}$$

11. The computer readable program storage device of claim 9 wherein $$\arg\min_z \tfrac{1}{2}\|z - (q_i + z_i)\|_2^2 + g(z) = WW^T(q_i + z_i).$$

12. A non-transitory program storage device readable by a computer, tangibly embodying a program of instructions executed by the computer to perform the method steps for parallel magnetic resonance imaging (MRI) reconstruction of digital images, the method comprising the steps of:
providing a set of acquired raw k-space MR image data v, a redundant Haar wavelet matrix W satisfying $W^T W = I$, wherein I is an identity matrix, a regularization parameter $\lambda \geq 0$, a counter limit k, an initial value of a dual variable p derived by forming a dual to a quadratic program $$\min_{z: z = WW^T z} \frac{1}{2}\|z - Wv\|_2^2 + \lambda\|z\|_1$$

that represents parallel reconstruction of a magnetic resonance (MR) image, and an initial value of a Lagrange multiplier $\tilde{q}$ of the constraint an initial value of $z = WW^T z$;
obtaining a proximal operator, the proximal operator obtained by the steps of:
calculating $$p_{i+1} = \operatorname*{argmin}_{p: \|p\|_\infty \leq \lambda} \frac{1}{2}\|p - (Wv - (I - WW^T)\tilde{q}_i)\|_2^2 \text{ for } 0 \leq i \leq k;$$

calculating an intermediate value $y_i = (Wv - (I - WW^T)\tilde{q}_i) - p_{i+1}$;
updating $$\tilde{q}_{i+1} = \operatorname*{argmin}_{\tilde{q}} \frac{1}{2}\|(I - WW^T)\tilde{q}_i - (Wv - p_i)\|_2^2;$$

calculating $q_{i+1} = (I - WW^T)\tilde{q}_{i+1}$;
calculating $z_{i+1} = (Wv - p_{i+1}) - q_{i+1}$,
wherein $x = W^T z$ is a solution of $$\min_x \frac{1}{2}\|Wx - Wv\|_2^2 + \lambda\|Wx\|_1$$

that specifies a reconstruction of the MR image; and
reconstructing a digital MR image by applying the proximal operator to the acquired raw k-space MR image data, the digital MR image displayable on a computer system display.

13. The computer readable program storage device of claim 12, wherein $$\operatorname*{argmin}_{\|p\|_\infty \leq \lambda} \frac{1}{2}\|p - (Wv - (I - WW^T)\tilde{q}_i)\|_2^2 =$$

$$\begin{cases} \lambda, & (Wv - (I - WW^T)\tilde{q}_i) > \lambda, \\ -\lambda, & (Wv - (I - WW^T)\tilde{q}_i) < -\lambda, \\ (Wv - (I - WW^T)\tilde{q}_i), & \text{otherwise.} \end{cases}$$

14. The computer readable program storage device of claim 12, wherein $\frac{1}{2}\|(I-WW^T)\tilde{q}_i-(Wv-p_i)\|_2^2$ is minimized by $(I-WW^T)\tilde{q}_{i+1}=(I-WW^T)(Wv-p_i)$.

15. The computer readable program storage device of claim 12, wherein, if dual variable p and Lagrange multiplier $\tilde{q}$ are both initialized to 0, $$\begin{aligned}y_i &= S(Wv - (I-WW^T)\tilde{q}_i, \lambda) \\ &= S(p_i + z_i, \lambda) \\ &= \operatorname*{argmin}_z \frac{1}{2}\|z - (p_i + z_i)\|_2^2 + f(z),\end{aligned}$$

wherein S is defined as $$S(v, \lambda) = \begin{cases} v - \lambda, & v > \lambda, \\ v + \lambda, & v < -\lambda, \\ 0, & \text{otherwise.} \end{cases}$$

16. The computer readable program storage device of claim 12, wherein, if dual variable p and Lagrange multiplier $\tilde{q}$ are both initialized to 0, $$\begin{aligned}z_{i+1} &= WW^T(Wv - p_{i+1}) \\ &= WW^T(q_i + y_i) \\ &= \operatorname*{argmin}_z \frac{1}{2}\|z - (q_i + y_i)\|_2^2 + g(z),\end{aligned}$$

wherein $g(z) = \begin{cases} 0, & z = WW^T z, \\ +\infty, & \text{otherwise.} \end{cases}$

* * * * *